March 25, 1969 J. C. GREESON, JR 3,435,365

MONOLITHICALLY FABRICATED OPERATIONAL AMPLIFIER DEVICE WITH SELF-DRIVE

Filed Oct. 1, 1965

INVENTOR
JAMES C. GREESON, JR.

BY John C. Black
ATTORNEY

United States Patent Office 3,435,365

Patented Mar. 25, 1969

3,435,365

MONOLITHICALLY FABRICATED OPERATIONAL AMPLIFIER DEVICE WITH SELF-DRIVE

James C. Greeson, Jr., Endwell, N.Y., assignor to International Business Machines Corporation, Armonk, N.Y., a corporation of New York Filed Oct. 1, 1965, Ser. No. 491,962
Int. Cl. H03f 3/68, 1/08, 1/34
U.S. Cl. 330—30 6 Claims

ABSTRACT OF THE DISCLOSURE

A monolithically fabricated operational amplifier is characterized by self-drive at high speeds and is operable alternatively as a current summing amplifier, a differential amplifier or a comparator. The amplifier includes first and second cascade-connected differential amplifying stages. A third differential amplifier responds to a voltage which is a function of the total collector current of the second stage to provide total emitter current to the first stage as an inverse function of said total collector current, thereby providing a closed loop with degenerative feedback which stabilizes the total current flow in the first and second stages.

Figure 1:
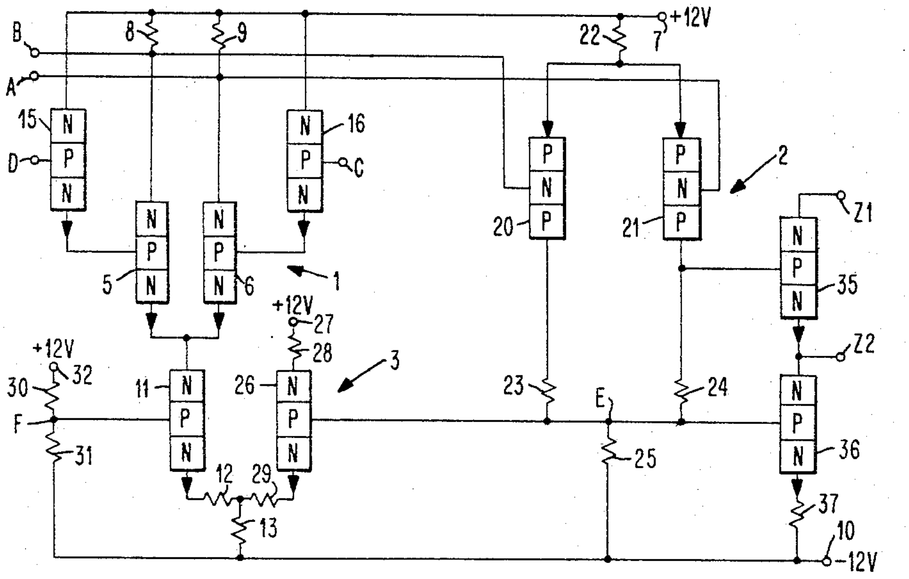

This application relates to an improved operational amplifier which is particularly well adapted to monolithic fabrication, has self-drive characteristics and is very versatile in that it can be used in several different environments of use depending upon the external connections made thereto.

Analog circuits are widely used today for interfacing or connecting analog transducers to digital and analog computers. The speed requirements for these circuits have continually increased over the past decade or more to the point where very high speeds of operation (e.g. approximately ten megacycle gain band width product) are necessary. The modern trend is toward integrated electronic circuits, the design of circuits particularly adapted for fabrication by monolithic techniques being highly desirable in order to achieve advantages in speed, space and economy.

Two of the most widely used analog circuits that are utilized in these interface systems are classified by function as the operational amplifier and the comparator. The operational amplifier is further classified by its mode of operation into at least two types, the current summing amplifier and the differential amplifier.

Structurally, the three circuits are quite similar; however, the functions they perform are different.

In the current summing mode, the amplifier provides an output voltage which is a linear function of the input currents at one input node and the ratios of the series and shunt precision resistors. The other input node is coupled to a reference level.

In both the differential amplifier and the comparator, input signals are applied to a pair of input nodes; and the output is a function of the relationship of the sense (polarity) of the two input signals with respect to one another.

In the differential amplifier mode, the output is a function of both the sense and the magnitude of the two inputs; whereas the output of a comparator is a function of only the sense of the difference in magnitude between the two inputs. The magnitude of the output of the differential amplifier mode bears a linear relationship with the difference in magnitude between the two input signals.

In the comparator mode, the output is a function of the sense of the inequality between two analog voltages within as wide a dynamic range as the input will accept. The output of a comparator must be compatible with commercially available diode-transistor switching (e.g. digital) logic circuits; whereas the outputs of current summing and differential amplifiers must be compatible with analog circuits. In the comparator mode, therefore, the output is at one or the other of two selected levels.

The requirements of a well-designed comparator with respect to its input circuit are similar to those of a well-designed operational amplifier.

All known commercially available operational amplifiers which are monolithically implemented are not particularly versatile. For example, commercially available monolithic devices which are intended for use as operational amplifiers cannot be used as comparators and vice versa. In addition, both types of commercially available devices lack the self-drive property at the speeds of operation encountered in modern equipment.

The monolithic technology is advantageous in the construction of direct-current balanced amplifiers because all transistors in the circuit are fabricated at one time on a single semiconductor chip in close proximity to one another. The property of an amplifier suitable for good differential operation is the ability for the in-phase and out-of-phase inputs of the device to operate linearly over a large voltage range centered about a reference level. With equal input drives, the output of the device should be at the reference level. Operation of the operational amplifier in either the differential or the summing mode at high speeds (e.g. approximately ten megacycle gain band width product) requires the use of low impedance scaling devices. As a result, in order to achieve a unit with self drive, a realtively large amount of output drive is a requirement.

The term self drive refers to the capability of the output portion of a circuit to provide sufficient current under normal operating conditions to drive the circuit itself and to drive succeeding circuits to which it is coupled without requiring intermediate powering-up stages.

Accordingly, it is a primary object of the present invention to provide an improved, monolithically constructed operational amplifier, e.g. one which is well adapted for fabrication on a single semiconductor chip.

It is another object of the present invention to provide an improved, monolithically constructed operational amplifier which can be used alternatively in the summing mode or in the differential amplifier mode with self-drive characteristics or as a comparator.

These objects are achieved in a preferred embodiment of the present invention by providing a first differential amplifier including a first pair of transistors of a first conductivity type having their emitter electrodes connected to a source of perfected constant current. The output of the differential amplifier is connected to the inputs of a second differential amplifier including a second pair of transistors of the opposite conductivity type having their collector electrodes connected to the operating supply voltage by way of respective individual load resistors and a common load resistor.

The junction between the common resistor and the individual resistors is connected to one input of a third differential amplifier which includes a third pair of transistors of the first conductivity type. One of the third pair of transistors has its base electrode connected to the abovesaid junction between the resistors, and the other transistor forms the perfected constant current source for the first differential amplifier. The latter transistor has its base electrode connected to a fixed reference voltage, the value of which is determined by a voltage divider connected between the operating supply potentials.

The first, second and third differential amplifiers form a closed loop with degenerative feedback which stabilizes the total current flow in both the first and second differential amplifiers.

The feedback circuit is particularly advantageous for achieving the versatile amplifier of the present application. Known common mode degenerative feedback circuits have a pair of high impedance resistors (in addition to the collector load resistors) connected from selected out-of-phase collector electrode outputs to a sampling node. The voltage at this node is compared with a separately generated reference voltage, and correction currents are generated to counteract movement of the voltage level at this sampling node from the reference. This latter method is not suitable in monolithic technology due to the expense of including the additional resistive components.

Highly satisfactory operating results and monolithic fabrication feasibility are achieved by applicant's improved feedback arrangement.

It is therefore another object of the present invention to provide an operational amplifier with an improved common mode feedback means which is particularly well adapted to monolithic technology.

The preferred embodiment of the present invention also includes, for the differential amplifier modes, a common collector output amplifier which is capable of symmetric current drive while holding the total semiconductor chip power dissipation to a reasonable level and maintaining Class A operation for optimum linearity. The emitter circuit of the common collector amplifier includes a constant current source comprising a second transistor of the same conductivity type. The base electrode of this latter transistor is connected to the base electrode of either of the transistors in the third differential amplifier, both of which latter base electrodes remain at a substantially constant voltage level. The base electrode of the common collector amplifier is connected to a selected one of the collector electrodes of the second differential amplifier.

In the comparator mode, the output amplifier is operated as a common emitter amplifier.

Accordingly, it is another important object of the present invention to provide an improved operational amplifier of monolithic fabrication which includes a low power dissipation output circuit including a common collector Class A amplifier with a high degree of linearity and balance in the positive and negative output drive levels for optimum self drive.

A monostable device insensitive to environmental changes or a highly stable oscillator can be constructed by the use of suitable peripheral discrete components in conjunction with the improved amplifier in its comparator mode.

It is therefore an object of the invention to provide an improved monostable device or an improved oscillator incorporating the improved amplifier of the present application.

The foregoing and other objects, features and advantages of the invention will be apparent from the following more particular description of preferred embodiments of the invention, as illustrated in the accompanying drawings.

In the drawings:

FIG. 1 is a schematic diagram of the improved operational amplifier of the present application; and FIGS. 2–5 inclusive are diagrammatic illustrations of various circuit configurations in which the circuit of FIG. 1 may be utilized to achieve different functions.

The improved amplifier of FIG. 1 includes first, second and third differential amplifiers 1, 2 and 3. The differential amplifier 1 includes a pair of transistors 5 and 6 having their collector electrodes connected to a positive supply terminal 7 by way of resistors 8 and 9. The emitter electrodes of the transistors 5 and 6 are connected to a negative supply terminal 10 by way of a transistor 11 which forms a part of the differential amplifier 3 and a pair of resistors 12 and 13.

In the preferred embodiment, the base electrodes of the transistors 5 and 6 are connected to input terminals D and C by way of the base emitter junctions of a second pair of transistors 15 and 16. The transistors 15 and 16, together with the transistors 5 and 6, provide a significantly increased input impedance for the amplifier. The collector electrodes of the transistors 5 and 6 are connected respectively to the base electrodes of a pair of transistors 20 and 21 which form the differential amplifier 2. The emitter electrodes of the transistors 20 and 21 are connected to the supply terminal 7 by way of a common resistor 22. The collector electrodes of the transistors 20 and 21 are connected to the negative supply terminal 10 by way of individual resistors 23 and 24 and a common resistor 25.

A junction E between the resistor 25 and the resistors 24 and 23 is connected to the base electrode of a transistor 26 which, together with the transistor 11, form the differential amplifier 3. The collector electrode of the transistor 26 is connected to a positive supply terminal 27 by way of a resistor 28. The emitter electrode of the transistor 26 is connected to the negative supply terminal 10 by way of a resistor 29 and the resistor 13. The base electrode of the transistor 11 is connected to the junction F between a pair of resistors 30 and 31 which form a voltage divider between the negative supply terminal 10 and a positive supply terminal 32.

An output transistor amplifier 35 has its base electrode connected to the collector electrode of the transistor 21 and has its collector electrode connected to an external terminal Z1. The emitter electrode of the transistor 35 is connected directly to a second external terminal Z2 and to the negative supply terminal 10 by way of a transistor 36 and a resistor 37. The transistor 36 has its base electrode connected to the junction E and forms a constant current source for the output amplifier 35 when the circuit of FIG. 1 is used as an operational amplifier in either the current summing mode or the differential amplifying mode.

An additional pair of external input terminals A and B are connected respectively to the collector electrodes of the transistors 5 and 6 and to the base electrodes of the transistors 20 and 21. The terminals A, B, C, D, Z1 and Z2 are the input and output terminals of the circuit of FIG. 1 which, as indicated above, is fabricated on a single semiconductor chip. It will be appreciated also that the supply terminals also form output terminals of the chip.

The operation of the circuit of FIG. 1 will be described very briefly without reference to the manner in which it is operated. It will be assumed that the resistors 30 and 31 had been selected so as to establish a predetermined potential at the junction F which, applied to the base electrode of the transistor 11, normally supplies a predetermined total current into the emitters of the transistors 5 and 6. Assuming that there are no signals of differing potential applied to the terminals C and D, this current through the transistors 5 and 6 will produce collector voltages which will produce currents in the transistors 20 and 21, the total of which equals a predetermined value. This current through the transistors 20 and 21 establishes a potential at the junction E which is equal to the potential at the junction F. Also this potential will establish a predetermined current in the constant current source 36 for driving the output amplifier 35.

Assume that for any one of several causes that the total current through the transistors 5 and 6 increases. This will cause the voltages at the collector electrodes of the transistors 5 and 6 to become more negative. This, in turn, will cause an increase in the total amount of the current flowing through the transistors 20 and 21 and this latter increased current will cause the voltage at the junction E to become more positive. With the voltage at the junction E more positive, the transistor 26 will begin to conduct more current and the transistor 11 less current. This decreased current in the transistor 11 will reduce the total amount of current flowing through the transistors 5 and 6, resisting the initial disturbance. It can therefore be seen that the network described above maintains the total amount of current through the transistors 5 and 6 substantially balanced thereby giving common mode stability.

In response to differential signals applied to the inputs C and D, the current through the transistors 5 and 6 will vary. That is, the current in one of the transistors 5 or 6 will increase while the amount of current in the other transistor will decrease by an opposite amount. However, the total amount of current flowing through both of the transistors will not vary.

Thus, if the potential applied to the terminal C becomes more positive than that applied to the terminal D, the current through the transistor 6 will increase and the current through the transistor 5 will decrease equally. As a result, the amount of current flowing through the transistor 20 will decrease while the amount of current flowing in the transistor 21 will increase. However, the total amount of current through the transistors 20 and 21 will be the same and the voltage at the junction E will remain constant. The increased current through the transistor 21 causes the collector electrode of the transistor 21 to go more positive, thereby causing the output Z2 to become more positive. In a somewhat similar manner, an input signal at the terminal D which is more positive than that at the input terminal C will produce a relatively negative going signal at the output terminal Z2.

Figure 2:
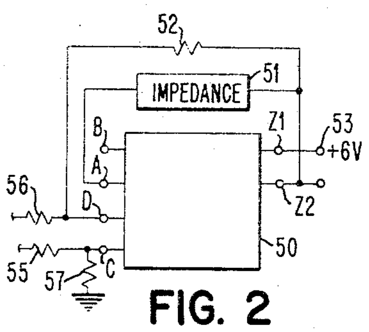

In FIG. 2, the circuit of FIG. 1 is represented by the block 50. The input and output terminals A, B, C, D, Z1 and Z2 are shown external to the block 50 for ease of explanation. It is assumed that the circuit of FIG. 2 illustrates one typical manner in which the amplifier is operated in the differential amplifier mode. The input terminal A is connected to the output terminal Z2 by way of an impedance 51 which may be resistive, capacitive or inductive as desired for the particular function. A resistor 52 connects the input terminal D to the output terminal Z2. The output terminal Z1 is connected to a positive supply terminal 53, whereby the transistor amplifier 35 of FIG. 1 is operated as a common collector amplifier. Input resistors 55 and 56 are connected respectively to the input terminals C and D. A resistor 57 connects the terminal C to ground potential.

When the input signals to the resistors 55 and 56 are equal (it being assumed that the product of the values of resistors 56 and 57 equal the product of the values of resistors 52 and 55), the voltage at the output terminal Z2 will be substantially at zero volts. When the input signals to the resistors 55 and 56 are not equal in magnitude and of the same polarity, the voltage at the output terminal Z2 will be a linear function of both the difference in magnitude and of the sense of the difference in magnitude.

Figures 3, 5:
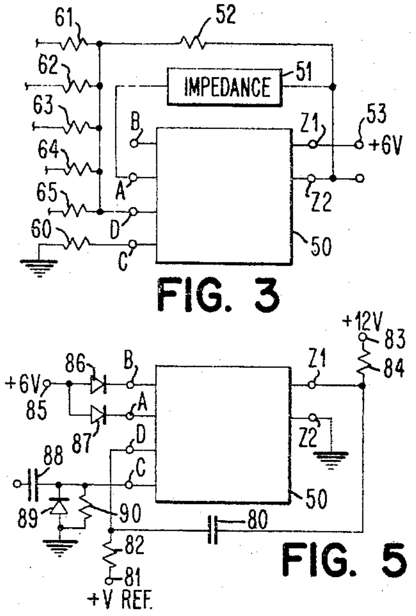

FIG. 3 illustrates the use of the amplifier of FIG. 1 as an operational amplifier in the current summing mode. This circuit is essentially similar to the circuit of FIG. 2 including resistor 52 and impedance 51, except that only one resistor 60 is connected to the input terminal C; and this resistor is connected to a reference potential illustrated as a ground potential. Also, the input terminal D is connected to a plurality of input resistors 61–65 inclusive. The output Z1 is again connected to positive supply terminal 53. The output at the terminal Z2 in FIG. 3 will be a linear function of the sum of the input signals applied to the resistors 61–65, inclusive and will be of the opposite polarity. Again, if all of the input signals to the resistors 61–65 of FIG. 3 are at the reference potential, then the output Z2 will be at ground potential.

Figure 4:
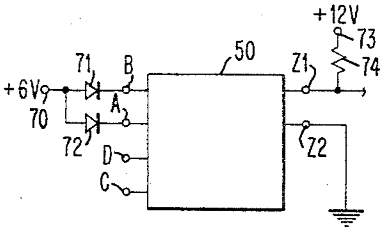

FIG. 4 shows the circuit 50 of FIG. 1 used in the comparator mode. In this mode, the input terminals A and B are each connected to a positive supply terminal 70 by way of diodes 71 and 72. These diodes prevent the transistors 5 and 6 from saturating (which would result in a lowered input impedance) by limiting the most negative collector voltage to a potential more positive than the most positive potential level which can be applied to the input terminals C and D.

The functioning of these diodes as described above is necessary to prevent saturation primarily in response to rapid transitions in the input signal level. The common mode feedback circuit will assure the operation of the transistors 5 and 6 out of saturation for slowly varying input signal levels.

The output terminal Z1 of the output amplifier 35 is connected in the illustrated embodiment to a positive supply terminal 73 by way of a resistor 74. This terminal also provides the output of the comparator. The emitter output Z2 is connected to ground potential, whereby the output amplifier 35 is now operated in the common emitter mode to produce signals at one or the other of two bi-valued levels. The input signals to the terminal C and D now control the output level at Z1. If the potential at the terminal D is more positive than the potential at the terminal C, the output terminal Z1 will be at its most positive value. When the potential at the terminal D is less positive than the potential at the terminal C, the output Z1 will be at its least positive value.

FIG. 5 illustrates the use of the circuit 50 of FIG. 1 again in the comparator mode. However, in this case, additional components external to the monolithic chip are provided for operating the amplifier and the associated components as a monostable multivibrator mode.

A capacitor 80 is coupled from the terminal Z1 to the terminal D and the terminal D is connected to a reference supply terminal 81 by way of a resistor 82. The output terminal Z1 is connected to a positive supply terminal 83 by way of a resistor 84. The terminal Z2 is connected to ground potential. The terminals A and B are connected to a positive supply terminal 85 by way of diodes 86 and 87. Input signals are coupled to terminal C by way of a differentiating signal including a capacitor 88, diode 89 and a resistor 90. The diode 89 clamps negative going signals to ground and becomes reverse biased by positive going transients. When a positive going signal is applied to a capacitor 88, its positive transition is coupled to terminal C. Then capacitor 88 is quickly charged to the potential of the input through resistor 90, terminal C returning to ground potential. The positive transition, assuming it is more positive than the potential at the terminal 81, will cause a negative going signal at Z1 which is coupled to terminal D through the relatively large capacitor 80. The capacitor 80 is substantially larger than the capacitor 88. Capacitor 80 will slowly charge toward a potential equal to that at the terminal 81; however as son as terminal D reaches ground potential, the output terminal Z1 will go positive, returning the circuit to its direct-current stable state.

The circuit of FIG. 1 can be utilized to advantage in any one of many well-known oscillator circuits which incorporate an operational amplifier as an integral part thereof.

The circuits of FIGS. 1–5, incusive, have been found to give very satisfactory performance with the component values set forth below; it will be appreciated however that these values are given merely by way of example and that the invention is not to be limited thereto:

| Resistors: | Values in Ohms |
|---|---|
| 8, 9, 23, 24 | 4300 |
| 12, 29 | 110 |
| 13 | 1200 |
| 22 | 1100 |
| 25 | 1500 |
| 28 | 9100 |
| 30 | 13000 |
| 31 | 3300 |
| 37 | 340 |
| 52, 55, 56, 57, 61–65, inclusive | 2000 |
| 60 | 333 |
| 74, 84 | 5000 |
| 82, 90 | 300000 |

| Capacitors: | Values |
|---|---|
| 80 ..........microfarad.. | .1 |
| 88 .......... | 10 |

It will be appreciated that various modifications may be made by those skilled in the art without departing from the teachings of the invention. For example, satisfactory operation can still be achieved by removing the resistors 12, 29 and 28. However, the inclusion of the resistors provides improved operation. In the event that a very high input impedance is not required, the transistors 15 and 16 can be removed. The base electrode of the transistor 36 can be connected alternatively to the junction E and the junction F, since both junctions are maintained at a substantially constant voltage level.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A monolithically fabricated amplifier circuit comprising first and second differential amplifiers each including respective first and second pairs of transistors of one conductivity type having base, emitter and collector electrodes;

a third differential amplifier including a third pair of transistors of the opposite conductivity type having their base electrodes connected to respective collector electrodes of the first differential amplifier, including first and second load impedances coupled to respective collector electrodes of the third pair of transistors, and including a third load impedance connected to the first and second impedances and common to both collector electrodes;

the junction between the third impedance and the first and second impedances being connected to the base electrode of one of the second pair of transistors;

means connecting a predetermined reference voltage to the base electrode of the other transistor in the second pair and connecting the collector electrode of said other transistor to the emitter electrodes of the first pair of transistors to provide a constant current source for said first pair;

said one transistor in the second pair of transistors responding to increases and decreases in the total collector current of the third pair of transistors to respectively cause decreases and increases in the current delivered by said other transistor in the second pair of transistors to the emitters of the first pair of transistors thereby maintaining the total current in the first and third differential amplifiers substantially constant; and an output circuit including a first output transistor amplifier having emitter and collector electrodes and having its base electrode connected to one of the collector electrodes of the third pair of transistors and including an additional transistor amplifier having its collector electrode connected to the emitter electrode of the output transistor amplifier and having its base electrode connected to the base electrode of said one transistor in the second pair to form a constant current source.

2. The amplifier circuit of claim 1 together with an additional pair of common collector transistor amplifiers coupling input signals to the base electrodes of the first pair of transistors to provide a high input impedance for the amplifier circuit.

3. The amplifier circuit of claim 1 together with voltage source means for operating the output amplifier as a Class A common collector amplifier;

a negative feedback impedance coupling the collector electrode of one transistor in the first pair to the emitter electrode of the output amplifier;

a resistor coupling the input of the other transistor in the first pair to the emitter electrode of the output amplifier; and an input circuit coupling input signals to the base electrodes of the first differential amplifier for operating the amplifier circuit in its differential amplifying mode.

4. The amplifier circuit of claim 1 together with voltage source means for operating the output amplifier as a Class A common collector amplifier;

a negative feedback impedance coupling the collector electrode of one transistor in the first pair to the emitter electrode of the output amplifier;

a resistor coupling the input of the other transistor in the first pair of the emitter electrode of the output amplifier; and an input circuit coupling input signals to one base electrode of the first differential amplifier and connecting the other base electrode of the first differential amplifier to a reference potential for operating the amplifier circuit in its current summing mode.

5. The amplifier circuit of claim 1 together with means connecting the output amplifier in a common emitter in a common emitter configuration for producing bivalued output signals at the collector electrode of the output amplifier as a function of the sense of the inequality between input signals applied to the base electrodes of the first pair of transistors.

6. The combination set forth in claim 5 together with means for operating the amplifier circuit in a monostable multivibrator mode of operation comprising a differentiating circuit connected to the base electrode of one transistor in the first pair and adapted to apply a differentiated signal to said base electrode in response to each input signal of a predetermined polarity to switch the first and third differential amplifiers from a stable operating state to a second operating state;

a capacitor of selected value coupled between the collector electrode of the first output transistor amplifier and the base electrode of the other transistor in the first pair for applying to the latter base electrode a potential of polarity opposite that of the differentiated signal in response to each differentiated input signal to maintain operation of the first and third differential amplifiers in said second operating state after the termination of the differentiated signal; and a large valued impedance coupling the latter base electrode to a selected reference voltage for charging the capacitor at a selected rate to return the latter base electrode to the reference potential and switch the first and third differential amplifiers to said stable operating state.

References Cited

UNITED STATES PATENTS

| | | | |
|---|---|---|---|
| 3,241,078 | 3/1966 | Jones .......... | 330—69 X |
| 3,290,520 | 12/1966 | Wennik .......... | 330—30 X |

ROY LAKE, *Primary Examiner.*

LAWRENCE J. DAHL, *Assistant Examiner.*

U.S. Cl. X.R.

330—28